United States Patent [19]

Tanno

[11] Patent Number: 4,983,863
[45] Date of Patent: Jan. 8, 1991

[54] LOGARITHMIC AMPLIFICATION CIRCUIT FOR OBTAINING OUTPUT VOLTAGE CORRESPONDING TO DIFFERENCE BETWEEN LOGARITHMICALLY AMPLIFIED VALUVES OF TWO INPUT CURRENTS

[75] Inventor: Masaya Tanno, Gunma, Japan

[73] Assignee: Sanyo Electric Co., Ltd., Moriguchi, Japan

[21] Appl. No.: 381,922

[22] Filed: Jul. 19, 1989

[30] Foreign Application Priority Data

Jul. 20, 1988 [JP] Japan ................. 63-180516

[51] Int. Cl.$^5$ ............ G01K 15/10; G06G 7/12
[52] U.S. Cl. ............................ 307/492; 328/145
[58] Field of Search ........... 307/492, 494, 495, 499, 307/498; 328/145

[56] References Cited

U.S. PATENT DOCUMENTS

| 3,369,128 | 2/1968 | Pearlman | 307/492 |
| 3,811,088 | 5/1974 | Hekimian | 328/145 |
| 4,080,075 | 3/1978 | Berg | 307/492 |
| 4,341,962 | 7/1982 | Buff | 307/492 |
| 4,716,306 | 12/1987 | Sato et al. | 307/494 |
| 4,737,668 | 4/1988 | Blet et al. | 328/145 |

FOREIGN PATENT DOCUMENTS 1117660 10/1984 U.S.S.R. ................. 307/492

OTHER PUBLICATIONS

"Practical Technique of Operational Amplifier", p. 150, issued Oct. 10, 1980.

Primary Examiner—Stanley D. Miller
Assistant Examiner—Toan Tran
Attorney, Agent, or Firm—Armstrong, Nikaido Marmelstein, Kubovcik & Murray

[57] ABSTRACT

A logarithmic amplification circuit is provided with a first transistor 10 having its collector supplied with a first input current, a second transistor 11 having its collector supplied with a second input current and being differentially connected to the first transistor, a comparing circuit 13 for receiving the first and second input currents to supply a signal corresponding to a difference between the two input currents to a base of the second transistor, and first and second constant current circuits 21 and 25 for supplying respective collectors of the first and the second transistors with equivalent compensating current. An output voltage corresponding to a difference between a logarithmically amplified value of the first input current and a logarithmically amplified value of the second input current can be obtained.

4 Claims, 1 Drawing Sheet

4,983,863

LOGARITHMIC AMPLIFICATION CIRCUIT FOR OBTAINING OUTPUT VOLTAGE CORRESPONDING TO DIFFERENCE BETWEEN LOGARITHMICALLY AMPLIFIED VALUVES OF TWO INPUT CURRENTS

BACKGROUND OF THE INVENTION

1. Field of the Invention

The present invention relates to a logarithmic amplification circuit, and more particularly, to a logarithmic amplification circuit incorporated in a semiconductor integrated circuit, which is capable of supplying output voltage corresponding to a difference between logarithmically amplified values of two input currents.

2. Description of the Background Art

FIG. 2 is a circuit diagram showing one example of a conventional logarithmic amplification circuit, and is, for example, described in a Japanese publication "Practical Technique of Operational Amplifier", pp. 150, issued Oct. 10, 1980. In the circuit of FIG. 2, an input terminal 3 is connected to a negative input end of a comparing circuit 1 through a resistor 2, and a positive input end of the comparing circuit 1 is grounded. An emitter-collector path of a transistor 5 having its base grounded is connected between the negative input end of the comparing circuit 1 and an output terminal 4. Now, if an input voltage of ei is applied to the input terminal 3, an output voltage $e_0$ obtained at the output terminal 4 will be as follows:

$$e_0 = \frac{kT}{q} \ln\left(\frac{ei}{RI_S}\right)$$

wherein:
q: electric charge of electron,
k: Boltzmann's constant
T: absolute temperature,
R: resistance value of the resistor 2,
$I_S$: saturation current of P/N junction Accordingly, the circuit of FIG. 2 is able to logarithmically amplify the input voltage ei.

However, the logarithmic amplification circuit of FIG. 2 had a problem in that it could not obtain an output corresponding to a difference between logarithmically amplified values of two input signals. Although a logarithmic amplification circuit for two input signals may be employed as being provided with a differential amplification circuit of two inputs-one output at a prior stage to the logarithmic amplification circuit shown in FIG. 2, such a circuit has a problem in that it leads to increase of the number of elements and deterioration of characteristics.

SUMMARY OF THE INVENTION

An object of the present invention is to provide a logarithmic amplification circuit in which an output voltage corresponding to a difference between logarithmically amplified values of two input currents can be obtained.

Another object of the present invention is to provide a logarithmic amplification circuit in which no fluctuation of an output voltage is caused even when input current is small or leak current is increased.

A further object of the present invention is to provide a logarithmic amplification circuit in which a dynamic range is extended.

The present invention, in short, is a logarithmic amplification circuit comprising a terminal for supplying a first input current; a terminal for supplying a second input current; a first transistor having its collector supplied with the first input current, an emitter and a base; a second transistor having its collector supplied with the second input current, an emitter and a base, and being differentially connected to the first transistor; a comparing circuit having input ends for receiving the first and the second input currents and an output end for generating a signal corresponding to a difference between the first and the second input currents, the output end being connected to the base of the second transistor; and first and second constant current circuits for supplying respective collectors of the first and the second transistors with compensating currents equivalent to each other, whereby obtaining from the output end of the comparing circuit, an output voltage corresponding to a difference between a logarithmically amplified value of the first input current and a logarithmically amplified value of the second input current.

A main advantage of the present invention is that since compensating currents are supplied to the collectors of the first and the second transistors from the first and the second constant current circuits, even if input current becomes small or 0, or undesired current such as leak current is increased, fluctuation of an output voltage can be prevented to maintain a stable operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
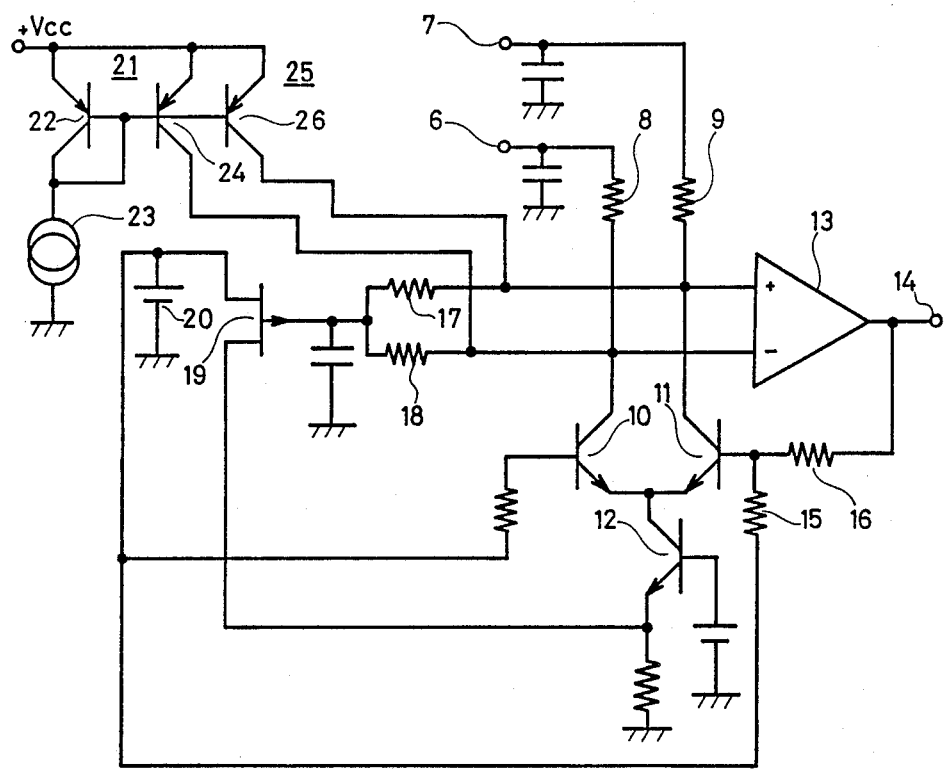
FIG. 1 is a circuit diagram showing a logarithmic amplification circuit of one embodiment of the present invention.
Figure 2:
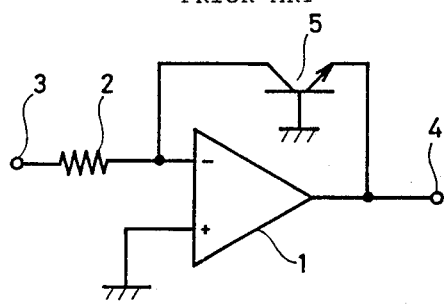
FIG. 2 is a circuit diagram showing a conventional logarithmic amplification circuit.

FIG. 1 is a circuit diagram showing a logarithmic amplification circuit of one embodiment of the present invention.

In FIG. 1, first and second input signals are respectively applied to first and second input terminals 6 and 7. The first and the second input signals are respectively converted into first and second input currents by means of first and second resistors 8 and 9. Then, the first input current is supplied to a collector of a first transistor 10, and the second input current is supplied to a collector of a second transistor 11. A collector of a constant current transistor 12 is connected to emitters of the first and the second transistors 10 and 11 connected in common. In addition, a comparing circuit 13 having its negative input end connected to the collector of the first transistor 10, its positive input end connected to the collector of the second transistor 11, and its output end connected to an output terminal 14 is provided. An output voltage obtained at the output terminal 14 is divided by means of voltage dividing resistors 15 and 16, to be applied to a base of the second transistor 11.

Positive and negative input ends of the comparing circuit 13 are connected in common by means of third and fourth resistors 17 and 18, and a common node of the third and the fourth resistors 17 and 18 is connected to a gate of an FET19. The FET19 has its drain connected to a reference power supply 20, and its source connected to an emitter of the constant current transistor 12.

A first constant current source 21 comprises a third transistor 22 of diode-connected type having its emitter connected to a power supply $+V_{CC}$, a constant current source 23 connected to a collector of the third transistor 22, and a fourth transistor 24 connected to the third transistor 22 to form current mirror relation, and a second constant current circuit 25 comprises the third transistor 22, the constant current source 23, and a fifth transistor 26 connected to the third transistor 22 to form current mirror relation.

Now, operation of a logarithmic amplification circuit of one embodiment of the present invention shown in FIG. 1 will be described.

In the circuit of FIG. 1, if first and second input voltages applied to the first and the second input terminals 6 and 7 are respectively represented as $V_1$ and $V_2$, first and second input currents $I_1$ and $I_2$ will be represented as the following equations.

$$I_1 = V_1/R_1, \quad I_2 = V_2/R_2 \tag{2}$$

wherein: $R_1$ and $R_2$ are resistance values of the first and the second resistors 8 and 9, respectively.

If both output currents of the first and the second constant current circuits 21 and 25 are equivalent to each other and represented as $I_a$, base-emitter voltages $V_{BE1}$ and $V_{BE2}$ of the first and the second transistors 10 and 11 will be represented as the following equations.

$$V_{BE1} = \frac{kT}{q} \ln\left(\frac{I_1 + I_a}{I_S}\right) \tag{3}$$

$$V_{BE2} = \frac{kT}{q} \ln\left(\frac{I_2 + I_a}{I_S}\right) \tag{4}$$

Therefore, an output voltage $V_0$ obtained at the output terminal 14 will be represented as the following equations.

$$\begin{aligned}
V_0 &= \frac{R_3 + R_4}{R_3}(V_{BE2} - V_{BE1}) \\
&= \frac{R_3 + R_4}{R_3} \cdot \\
&\quad \frac{kT}{q}\left\{\ln\left(\frac{I_2 + I_a}{I_S}\right) - \ln\left(\frac{I_1 + I_a}{I_S}\right)\right\} \\
&= \frac{R_3 + R_4}{R_3} \cdot \frac{kT}{q} \ln\left(\frac{I_2 + I_a}{I_1 + I_a}\right)
\end{aligned} \tag{5}$$

wherein $R_3$ and $R_4$ are resistance values of voltage dividing resistors 15 and 16, respectively.

Now, in the above equation (5), when both of the first and the second input currents $I_1$ and $I_2$ become 0, $V_0$ also becomes 0. More specifically, it can be appreciated that in the absence of input current, no output voltage is generated. In addition, in the circuit of FIG. 1, if $I_2 = 0$, while $I_1 = I_b$ due to existence of current caused by offset of an input voltage or leak current, the output voltage $V_0$ will be represented as the following equation from the above equation (5)

$$V_0 = \frac{R_3 + R_4}{R_3} \cdot \frac{kT}{q} \ln \frac{I_a}{I_b + I_a} \tag{6}$$

In this case, as long as the output current $I_a$ of the first and the second constant current circuits 21 and 25 is set so as to be $I_b < I_a$, even if inconvenient current such as leak current and the like exists, the output voltage can be held approximately 0 in the absence of an input signal. More specifically, if there are not the first and the second constant current circuits 21 and 25, as apparent from the above equation (6), the undesired current $I_b$ is increased and an undesired output voltage is generated at a higher level in the absence of an input signal.

Although the value of leak current is changed depending on processing technique for integration of circuits, it is usually of approximately several hundreds pA. Accordingly, if the value of the output constant current $I_a$ of the first and the second constant current circuits 21 and 25 is set at approximately 100 nA, the above bad effect of leak current is negligible.

In case of the logarithmic amplification circuit of FIG. 1, the value of the output constant current $I_a$ of the first and the second constant current circuits 21 and 25 is needed to be smaller in order to maintain a enough dynamic range. Accordingly, it is necessary to set the value of the output constant current $I_a$ at an appropriate value in consideration both of a dynamic range and prevention of occurrence of undesired output voltage.

The third and the fourth resistors 17 and 18 for connecting the positive and negative input ends of the comparing circuit 13 in common, and the FET19 having its gate connected to the common node of the third and the fourth resistors 17 and 18, are arranged in order to extend the dynamic range with respect to an in-phase input. More specifically, source current of the FET19 is reduced and collector current of the constant current transistor 12 is increased when the in-phase input becomes large, so that the dynamic range can be extended.

As the above, according to one embodiment of the present invention, an output voltage corresponding to a difference between logarithmically amplified values of two input currents can be obtained. In addition, since compensating currents are supplied from the first and the second constant current circuits to respective collectors of the first and the second transistors, bad effects such as output fluctuation due to undesired current such as leak current and the like can be prevented. In particular, if the above value of the constant current is set at a predetermined value large enough as compared with the leak current and the like while small enough as compared with minimum operation current of the signal current, extension of the dynamic range as well as stabilization of circuits and prevention of fluctuation of output voltage becomes possible. In addition, operation current of a differential amplification circuit comprising first and second transistors is changed according to an in-phase input, the dynamic range can be further extended.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A logarithmic amplification circuit comprising:
   means for supplying a first input current;
   means for supplying a second input current;
   a first transistor having a collector operably connected to said first input current supplying means and being supplied with said first input current, said first transistor further having an emitter and a base;
   a second transistor having a collector operably connected to said second input current supplying means and being supplied with said second input current, said second transistor further having an emitter and a base, said second transistor being differentially connected to said first transistor;
   comparing circuit means having input ends connected to respective collectors of said first and second transistors, and an output end for supplying a signal corresponding to a difference between said first and second input currents, said output end being connected to said base of said second transistor; and
   first and second constant current circuit means for supplying compensating currents equivalent to each other to said respective collectors of said first and second transistors, whereby output voltage corresponding to a difference between a logarithmically amplified value of said first input current and a logarithmically amplified value of said second input current can be obtained from said output end of the comparing circuit means.

2. A logarithmic amplification circuit according to claim 1, wherein
   said first constant current circuit means includes:
   a power supply,
   a third transistor having an emitter connected to said power supply, said third transistor further having a collector and a base, said collector and said base being connected in common,
   a constant current source for supplying said third transistor with constant current,
   a fourth transistor connected to said third transistor to form a current mirror, and wherein
   said second constant current circuit means includes:
   said power supply,
   said third transistor,
   said constant current source, and
   a fifth transistor connected to said third transistor to form another current mirror.

3. A logarithmic amplification circuit according to claim 1, wherein values of said compensating currents supplied from said first and second constant current circuit means are set at values larger than that of a leakage current, and smaller than that of minimum operation current of said first and second input currents.

4. A logarithmic amplification circuit according to claim 1, wherein said first and second transistors having resistance values equivalent to each other, sand wherein said first and second transistors have collectors which are connected to a common node, and wherein operation currents of said first and second transistors are changed corresponding to current flowing through said common node.

* * * * *

UNITED STATES PATENT AND TRADEMARK OFFICE
CERTIFICATE OF CORRECTION

PATENT NO. : 4,983,863

DATED : January 8, 1991

INVENTOR(S) : Masaya TANNO

It is certified that error appears in the above-identified patent and that said Letters Patent is hereby corrected as shown below:

On the cover page, Item [54], 5th line, "VALUVES", should read -- VALUES --.

Signed and Sealed this

Fifteenth Day of September, 1992

Attest:

DOUGLAS B. COMER

*Attesting Officer*      *Acting Commissioner of Patents and Trademarks*